US011397202B2

(12) United States Patent
Ahn

(10) Patent No.: US 11,397,202 B2
(45) Date of Patent: Jul. 26, 2022

(54) COMPARATOR AND RECEIVER INCLUDING THE SAME

(71) Applicant: Samsung Display Co., Ltd., Yongin-si (KR)

(72) Inventor: Jeong Keun Ahn, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 223 days.

(21) Appl. No.: 16/555,833

(22) Filed: Aug. 29, 2019

(65) Prior Publication Data

US 2020/0116765 A1 Apr. 16, 2020

(30) Foreign Application Priority Data

Oct. 11, 2018 (KR) .................. 10-2018-0121379

(51) Int. Cl.
*G01R 19/165* (2006.01)
*H03K 5/24* (2006.01)

(52) U.S. Cl.
CPC ..... *G01R 19/16566* (2013.01); *H03K 5/2418* (2013.01)

(58) Field of Classification Search
None
See application file for complete search history.

(56) References Cited

U.S. PATENT DOCUMENTS

| | | | | | |
|---|---|---|---|---|---|
| 5,418,409 | A * | 5/1995 | Kuhn | ..................... | H03K 5/088 327/78 |
| 5,933,459 | A * | 8/1999 | Saunders | ............. | H04L 25/061 327/52 |
| 6,262,602 | B1 * | 7/2001 | Draving | ............... | H03K 5/1252 327/74 |
| 7,541,845 | B2 * | 6/2009 | Noh | ...................... | H04L 25/062 327/91 |
| 7,809,999 | B2 * | 10/2010 | McCandless | .... | G01R 31/31932 714/724 |
| 8,823,419 | B1 * | 9/2014 | O'Leary | .................. | H03K 5/22 327/205 |
| 9,490,967 | B1 * | 11/2016 | Payne | ................. | H04L 25/0272 |
| 9,584,149 | B2 * | 2/2017 | Suzuki | .................... | H03M 1/36 |
| 9,806,918 | B1 * | 10/2017 | Su | ..................... | H04L 25/03146 |
| 2011/0204889 | A1 * | 8/2011 | Nomura | ................. | G01R 1/203 324/252 |
| 2014/0070845 | A1 * | 3/2014 | Tian | ........................ | H04L 25/02 330/252 |

(Continued)

FOREIGN PATENT DOCUMENTS

KR 10-2019-0027983 A 3/2019

*Primary Examiner* — Daniel C Puentes
*Assistant Examiner* — Khareem E Almo
(74) *Attorney, Agent, or Firm* — Lewis Roca Rothgerber Christie LLP

(57) ABSTRACT

A comparator includes: a first selector for selecting one of a first reference voltage and a first correction reference voltage, based on a first determination value of data at a past time of a first adjacent channel; a first comparator for comparing the difference between a voltage selected from the first reference voltage and the first correction reference voltage and a second reference voltage with an input voltage at a current time of a target channel; and a first output unit for determining an output voltage at the current time of the target channel, based on the comparison result of the first comparator.

20 Claims, 10 Drawing Sheets

(56) References Cited

U.S. PATENT DOCUMENTS

| | | | |
|---|---|---|---|
| 2015/0015315 A1* | 1/2015 | Qin | H03K 5/1565 |
| | | | 327/175 |
| 2015/0187335 A1* | 7/2015 | Sugiyama | H04N 5/3765 |
| | | | 345/208 |
| 2016/0209462 A1* | 7/2016 | Choi | H04B 3/46 |
| 2016/0308516 A1* | 10/2016 | Narayan | G01R 23/06 |
| 2017/0063351 A1* | 3/2017 | Kurokawa | G06N 3/049 |
| 2017/0134189 A1* | 5/2017 | Sadeghi-Emamchaie | |
| | | | H04L 27/2627 |
| 2017/0302267 A1* | 10/2017 | Luo | H04L 25/03343 |
| 2019/0072589 A1* | 3/2019 | Loh | G01R 19/155 |
| 2019/0074863 A1* | 3/2019 | Ahn | H04B 3/32 |
| 2019/0265280 A1* | 8/2019 | Kimura | G05F 3/16 |
| 2019/0334491 A1* | 10/2019 | Schober | H03K 19/00384 |
| 2020/0013320 A1* | 1/2020 | Yamamoto | G01R 35/00 |
| 2020/0116765 A1* | 4/2020 | Ahn | G01R 19/16566 |
| 2020/0191849 A1* | 6/2020 | Pereira | H03B 5/20 |
| 2020/0350918 A1* | 11/2020 | Zerbe | H03K 3/0315 |
| 2021/0067153 A1* | 3/2021 | Majima | H03K 17/08 |

\* cited by examiner

| D2[m−1] | D1[m−1] | CH2 | D2[m] |
|---|---|---|---|
| 1 | 0 | >VH− | 1 |
| | | <VH− | 0 |
| | 1 | >VH | 1 |
| | | <VH | 0 |
| 0 | 0 | >VL | 1 |
| | | <VL | 0 |
| | 1 | >VL+ | 1 |
| | | <VL+ | 0 |

| D2[m-1] | D1[m-1] | D3[m-1] | CH2 | D2[m] |
|---|---|---|---|---|
| 1 | 0 | 0 | >VH- | 1 |
| | | | <VH- | 0 |
| | 1 | 0 | >VH | 1 |
| | 0 | 1 | | |
| | 1 | 1 | <VH | 0 |
| 0 | 0 | 0 | >VL | 1 |
| | 1 | 0 | | |
| | 0 | 1 | <VL | 0 |
| | 1 | 1 | >VL+ | 1 |
| | | | <VL+ | 0 |

COMPARATOR AND RECEIVER INCLUDING THE SAME

CROSS-REFERENCE TO RELATED APPLICATION

The present application claims priority to and the benefit of Korean patent application No. 10-2018-0121379 filed on Oct. 11, 2018 in the Korean Intellectual Property Office, the entire disclosure of which is incorporated herein by reference.

BACKGROUND

1. Field

Aspects of some example embodiments of the present disclosure generally relate to a comparator and a receiver including the same.

2. Related Art

Major noise that causes degradation of a signal in a transmitting/receiving system in which a transmitter and a receiver are connected to each other through a single channel is inter-symbol interface (ISI).

In addition to the ISI, crosstalk further occurs in a high-speed parallel link system in which a transmitter and a receiver are connected to each other through a plurality of channels. The crosstalk includes jitter, in which the phase of a signal received through a victim channel is changed, glitch, in which the magnitude of a signal is changed, and the like.

The above information in the Background section is only for enhancement of understanding of the background of the technology and therefore it should not be construed as admission of existence or relevancy of the prior art.

SUMMARY

Aspects of some example embodiments may include a comparator capable of minimizing or reducing the influence of crosstalk caused by an adjacent channel and a receiver including the comparator.

According to some example embodiments of the present disclosure, a comparator includes: a first selector configured to select one of a first reference voltage and a first correction reference voltage, based on a first determination value of data at a past time of a first adjacent channel; a first comparator configured to compare the difference between a voltage selected from the first reference voltage and the first correction reference voltage and a second reference voltage with an input voltage at a current time of a target channel; and a first output unit configured to determine an output voltage at the current time of the target channel, based on the comparison result of the first comparator.

According to some example embodiments, the input voltage may be a differential signal and include a first input voltage and a second input voltage. The first comparator may compare the difference between the first input voltage and the second input voltage with the difference between the voltage selected from the first reference voltage and the first correction reference voltage and the second reference voltage.

According to some example embodiments, the comparator may further include: a second selector configured to select one of the second reference voltage and a second correction reference voltage, based on the first determination value; a second comparator configured to compare the difference between a voltage selected from the second reference voltage and the second correction reference voltage and the first reference voltage with the input voltage; and a second output unit configured to determine an output voltage at the current time of the target channel, based on the comparison result of the second comparator.

According to some example embodiments, the first correction reference voltage may have a value between the first reference voltage and the second reference voltage, and the second correction reference voltage may have a value between the first reference voltage and the second reference voltage. The first correction reference voltage may be larger than the second correction reference voltage.

According to some example embodiments, the first selector may include: a first inverter inverting the first determination value; a first transistor having a gate electrode to which a clock signal is applied and one electrode connected to a first power source; a second transistor having a gate electrode connected to an output end of the first inverter and one electrode connected to the other electrode of the first transistor; a third transistor having a gate electrode to which the first correction reference voltage is applied, one electrode connected to the other electrode of the second transistor, and the other electrode connected to a first node; and a fourth transistor having a gate electrode to which the second reference voltage is applied, one electrode connected to the other electrode of the second transistor, and the other electrode connected to a second node.

According to some example embodiments, the first selector may further include: a fifth transistor having a gate electrode to which the clock signal is applied and one electrode connected to the first power source; a sixth transistor having a gate electrode to which the first determination value is applied and one electrode connected to the other electrode of the fifth transistor; a seventh transistor having a gate electrode to which the first reference voltage is applied, one electrode connected to the other electrode of the sixth transistor, and the other electrode connected to the first node; and an eighth transistor having a gate electrode to which the second reference voltage is applied, one electrode connected to the other electrode of the sixth transistor, and the other electrode connected to the second node.

According to some example embodiments, the first comparator may include: a ninth transistor having a gate electrode to which the clock signal is applied and one electrode connected to the first power source; a tenth transistor having a gate electrode to which a turn-on level voltage is applied and one electrode connected to the other electrode of the ninth transistor; an eleventh transistor having a gate electrode to which the first input voltage is applied, one electrode connected to the other electrode of the tenth transistor, and the other electrode connected to the second node; and a twelfth transistor having a gate electrode to which the second input voltage is applied, one electrode connected to the other electrode of the tenth transistor, and the other electrode connected to the first node.

According to some example embodiments, the first comparator may further include: a thirteenth transistor having a gate electrode to which the clock signal is applied, one electrode connected to the second node, and the other electrode connected to a second power source; a fourteenth transistor having a gate electrode to which the clock signal is applied, one electrode connected to the first node, and the other electrode connected to the second power source; a fifteenth transistor having a gate electrode connected to the second node, one electrode connected to the first power source, and the other electrode connected to a first output terminal; and a sixteenth transistor having a gate electrode connected to the first node, one electrode connected to the first power source, and the other electrode connected to a second output terminal.

According to some example embodiments, the first output unit may include: a second inverter having an input end connected to the first output terminal and an output end connected to the second output terminal; a third inverter having an input end connected to the second output terminal and an output end connected to the first output terminal; and a seventeenth transistor having a gate electrode to which an inverting signal of the clock signal is applied, one electrode connected to a power terminal of the second inverter and a power terminal of the third inverter, and the other electrode connected to the second power source.

According to some example embodiments, the second selector may include: a fourth inverter inverting the first determination value; an eighteenth transistor having a gate electrode to which the clock signal is applied and one electrode connected to the first power source; a nineteenth transistor having a gate electrode connected to an output end of the fourth inverter and one electrode connected to the other electrode of the eighteenth transistor; a twentieth transistor having a gate electrode to which the first reference voltage is applied, one electrode connected to the other electrode of the nineteenth transistor, and the other electrode connected to a third node; and a twenty-first transistor having a gate electrode to which the second reference voltage is applied, one electrode connected to the other electrode of the nineteenth transistor, and the other electrode connected to a fourth node.

According to some example embodiments, the second selector may further include: a twenty-second transistor having a gate electrode to which the clock signal is applied and one electrode connected to the first power source; a twenty-third transistor having a gate electrode to which the first determination value is applied and one electrode connected to the other electrode of the twenty-second transistor; a twenty-fourth transistor having a gate electrode to which the first reference voltage is applied, one electrode connected to the other electrode of the twenty-third transistor, and the other electrode connected to the third node; and a twenty-fifth transistor having a gate electrode to which the second correction reference voltage is applied, one electrode connected to the other electrode of the twenty-third transistor, and the other electrode connected to the fourth node.

According to some example embodiments, the second comparator may include: a twenty-sixth transistor having a gate electrode to which the clock signal is applied and one electrode connected to the first power source; a twenty-seventh transistor having a gate electrode to which the turn-on level voltage is applied and one electrode connected to the other electrode of the twenty-sixth transistor; a twenty-eighth transistor having a gate electrode to which the second input voltage is applied, one electrode connected to the other electrode of the twenty-seventh transistor, and the other electrode connected to the fourth node; and a twenty-ninth transistor having a gate electrode to which the first input voltage is applied, one electrode connected to the other electrode of the twenty-seventh transistor, and the other electrode connected to the third node.

According to some example embodiments, the second comparator may further include: a thirtieth transistor having a gate electrode to which the clock signal is applied, one electrode connected to the fourth node, and the other electrode connected to the second power source; a thirty-first transistor having a gate electrode to which the clock signal is applied, one electrode connected to the third node, and the other electrode connected to the second power source; a thirty-second transistor having a gate electrode connected to the fourth node, one electrode connected to the first power source, and the other electrode connected to a third output terminal; and a thirty-third transistor having a gate electrode connected to the third node, one electrode connected to the first power source, and the other electrode connected to a fourth output terminal.

According to some example embodiments, the second output unit may include: a fifth inverter having an input end connected to the third output terminal and an output end connected to the fourth output terminal; a sixth inverter having an input end connected to the fourth output terminal and an output end connected to the third output terminal; and a thirty-fourth transistor having a gate electrode to which the inverting signal of the clock signal is applied, one electrode connected to a power terminal of the fifth inverter and a power terminal of the sixth inverter, and the other electrode connected to the second power source.

According to some example embodiments of the present disclosure, a comparator includes: a first selector configured to select one of a first reference voltage and a first correction reference voltage, based on a first determination value of data at a past time of a first adjacent channel and a second determination value of data at a past time of a second adjacent channel; a first comparator configured to compare the difference between a voltage selected from the first reference voltage and the first correction reference voltage and a second reference voltage with an input voltage at a current time of a target channel; and a first output unit configured to determine an output voltage at the current time of the target channel, based on the comparison result of the first comparator.

According to some example embodiments, the comparator may further include: a second selector configured to select one of the second reference voltage and a second correction reference voltage, based on the first determination value and the second determination value; a second comparator configured to compare the difference between a voltage selected from the second reference voltage and the second correction reference voltage and the first reference voltage with the input voltage; and a second output unit configured to determine an output voltage at the current time of the target channel, based on the comparison result of the second comparator.

According to some example embodiments, the first selector may include: a first NOR gate receiving the first determination value and the second determination value; a first transistor having a gate electrode to which a clock signal is applied and one electrode connected to a first power source; a second transistor having a gate electrode to which an output value of the first NOR gate is applied and one electrode connected to the other electrode of the first transistor; a third transistor having a gate electrode to which the first correction reference voltage is applied, one electrode connected to the other electrode of the second transistor, and the other electrode connected to a first node; a fourth transistor having a gate electrode to which the second reference voltage is applied, one electrode connected to the other electrode of the second transistor, and the other electrode connected to a second node; a first inverter inverting the output value of the first NOR gate; a fifth transistor having a gate electrode to which the clock signal is applied and one electrode connected to the first power source; a sixth transistor having a gate electrode connected to an output end of the first inverter and one electrode connected to the other electrode of the fifth transistor; a seventh transistor having a gate electrode to which the first reference voltage is applied, one electrode connected to the other electrode of the sixth transistor, and the other electrode connected to the first node; and an eighth transistor having a gate electrode to which the second reference voltage is applied, one electrode connected to the other electrode of the sixth transistor, and the other electrode connected to the second node.

According to some example embodiments, the second selector may include: a first NAND gate receiving the first determination value and the second determination value; an eighteenth transistor having a gate electrode to which the clock signal is applied and one electrode connected to the first power source; a nineteenth transistor having a gate electrode to which an output voltage of the first NAND gate is applied and one electrode connected to the other electrode of the eighteenth transistor; a twentieth transistor having a gate electrode to which the first reference voltage is applied, one electrode connected to the other electrode of the nineteenth transistor, and the other electrode connected to a third node; a twenty-first transistor having a gate electrode to which the second reference voltage is applied, one electrode connected to the other electrode of the nineteenth transistor, and the other electrode connected to a fourth node; a fourth inverter inverting the output value of the first NAND gate; a twenty-second transistor having a gate electrode to which the clock signal is applied and one electrode connected to the first power source; a twenty-third transistor having a gate electrode connected to an output end of the fourth inverter and one electrode connected to the other electrode of the twenty-second transistor; a twenty-fourth transistor having a gate electrode to which the first reference voltage is applied, one electrode connected to the other electrode of the twenty-third transistor, and the other electrode connected to the third node; and a twenty-fifth transistor having a gate electrode to which the second correction reference voltage is applied, one electrode connected to the other electrode of the twenty-third transistor, and the other electrode connected to the fourth node.

According to some example embodiments of the present disclosure, a receiver includes: a first comparator configured to select one of a first reference voltage and a first correction reference voltage, based on a determination value of data at a past time of at least one adjacent channel, and compare the difference between the selected voltage and a second reference voltage with an input voltage at a current time of a target channel; a second comparator configured to select one of the second reference voltage and a second correction reference value, based on the determination value of the data at the past time of the at least one adjacent channel, and compare the difference between the selected voltage and the first reference voltage with the input voltage; and a multiplexer configured to output one of an output value of the first comparator and an output value of the second comparator as a determination value of data at the current time of the target channel, based on a determination value of data at a past time of the target channel.

According to some example embodiments, the first correction reference voltage may have a value between the first reference voltage and the second reference voltage, and the second correction reference voltage may have a value between the first reference voltage and the second reference voltage. The first correction reference voltage may be larger than the second correction reference voltage.

BRIEF DESCRIPTION OF THE DRAWINGS

Aspects of some example embodiments will now be described more fully hereinafter with reference to the accompanying drawings; however, they may be embodied in different forms and should not be construed as limited to the embodiments set forth herein. Rather, these embodiments are provided so that this disclosure will be more thorough and more complete, and will more fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
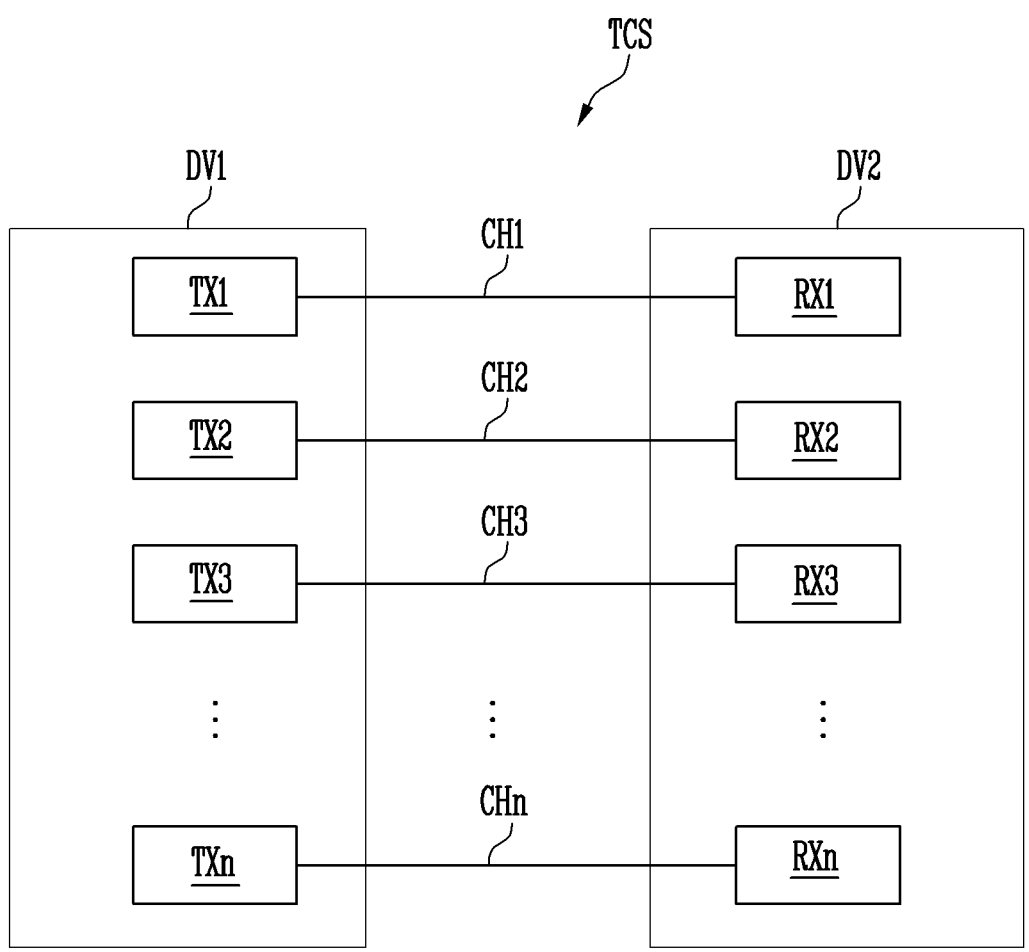
FIG. 1 is a diagram illustrating a receiver and a transceiver including the same according to some example embodiments of the present disclosure.

Hereinafter, aspects of some example embodiments are described in more detail with reference to the accompanying drawings so that those skilled in the art may easily practice the present disclosure. The present disclosure may be implemented in various different forms and is not limited to the example embodiments described in the present specification.

Description of some components that may be irrelevant to understanding the example embodiments may be omitted to more clearly describe the present disclosure, and the same or similar constituent elements will be designated by the same reference numerals throughout the specification. Therefore, the same reference numerals may be used in different drawings to identify the same or similar elements.

In addition, the size and thickness of each component illustrated in the drawings are arbitrarily shown for better understanding and ease of description, but the present disclosure is not limited thereto. Thicknesses of several portions and regions are exaggerated for clear expressions.

FIG. 1 is a diagram illustrating a receiver and a transceiver including the same according to some example embodiments of the present disclosure.

Referring to FIG. 1, the transceiver TCS according to some example embodiments of the present disclosure includes a transmitter DV1 and a receiver DV2.

The transmitter DV1 includes transmitting units TX1, TX2, TX3, . . . , and TXn connected to corresponding channels CH1, CH2, CH3, . . . , CHn.

The receiver DV2 includes receiving units RX1, RX2, RX3, . . . , and RXn connected to the corresponding channels CH1, CH2, CH3, . . . , CHn.

For example, the transceiver TSC may be a memory system. The channels CH1 to CHn may constitute a memory bus, and the transmitter DV1 and the receiver DV2 may be a transmitter and a receiver at the side of a controller or memory. The memory may be a frame memory of a display device such as a liquid crystal display (LCD) or an organic light emitting display (OLED). The frame memory may be used as a frame buffer in the display device, and store pixel data with respect to a specific frame.

However, the receiver DV2 of this embodiment is not necessarily applied to the memory system, and may be applied to any field as long as the receiver DV2 is a parallel link system connected to a transmitter through a plurality of channels.

Figure 2:
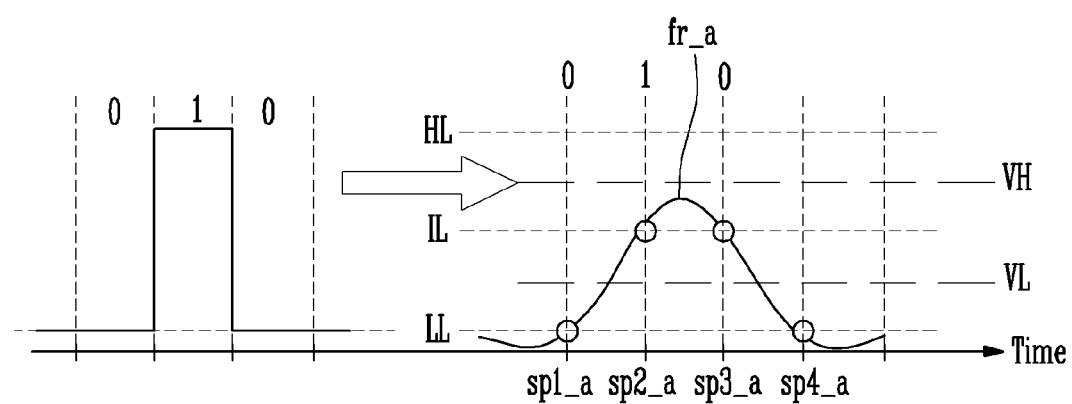
FIG. 2 is a diagram illustrating a reception signal with respect to a transmission signal.
Figure 3:
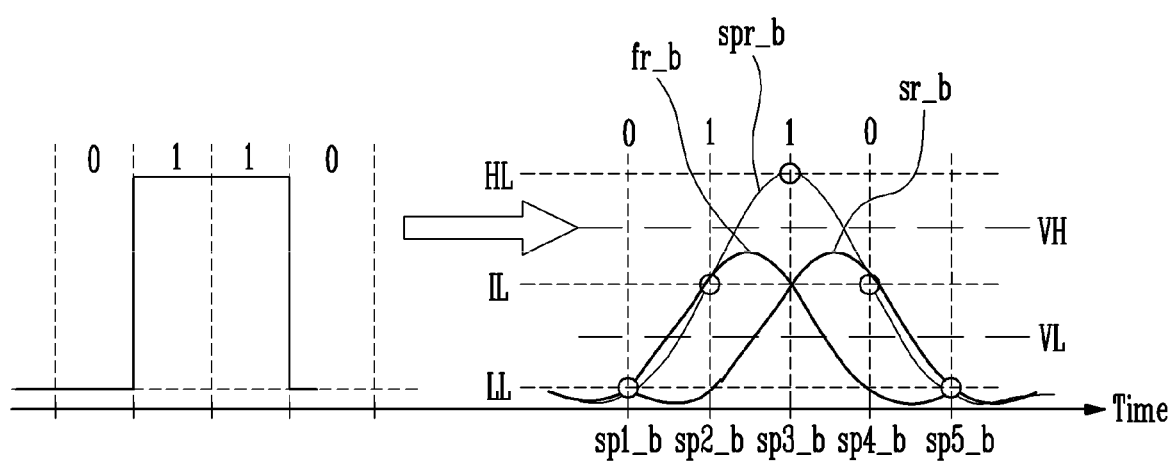
FIG. 3 is a diagram illustrating a reception signal with respect to another transmission signal.

FIG. 2 is a diagram illustrating a reception signal with respect to a transmission signal. FIG. 3 is a diagram illustrating a reception signal with respect to another transmission signal.

In FIGS. 2 and 3, an ideal case where crosstalk does not exist is assumed. In FIGS. 2 and 3, the interval between adjacent sampling times is a unit interval (1UI).

In FIGS. 2 and 3, a changeable level of a reception signal may be one of no less than a lowest level LL and no more than a highest level HL. An intermediate level IL has a value between the lowest level LL and the highest level HL.

Referring to FIG. 2, an example reception signal fr_a of the receiver DV2, which passes through an arbitrary channel, when the transmitter DV1 transmits a transmission signal of which binary level is 0, 1, 0 through the channel is illustrated. A case where the other data of the transmission signal, which are not shown in FIG. 2, have binary level 0 is assumed.

The shape of the reception signal fr_a shown in FIG. 2 may be acquired when the channel is designed a low pass filter. Therefore, according to some example embodiments, each of the plurality of channels CH1 to CHn connecting the transmitter DV1 and the receive DV2 may be designed as a low pass filter.

The reception signal following a response shape shown in FIG. 2 may be referred to as a duo-binary signal. The response shape shown in FIG. 2 may be obtained even when the transmitter DV1 includes an encoder for duo-binary signaling, in addition to when the channel is designed as a low pass filter.

There are various duo-binary signaling methods. However, in general, in the case of the reception signal fr_a of FIG. 2, a cursor of a sampling time sp1_a becomes a pre-cursor, a cursor of a sampling time sp2_a becomes a main cursor, a cursor of a sampling time sp3_a becomes a first post-cursor, and a cursor of a sampling time sp4_a becomes a second post-cursor. Various known methods may be used such that a level (magnitude) of the main cursor is equal to that of the first post-cursor so as to properly apply the duo-binary signaling.

Referring to FIG. 3, an example reception signal spr_b of the receiver DV2, which passes through an arbitrary channel, when the transmitter DV1 transmits a transmission signal of which binary level is 0, 1, 1, 0 through the channel is illustrated. A case where the other data of the transmission signal, which are not shown in FIG. 3, have the binary level 0 is assumed.

In FIG. 3, the reception signal spr_b may be an overlapping signal of a response signal fr_b corresponding to first binary level 1 and a response signal sr_b corresponding to second binary level 1. In general, in the case of the response signal fr_b, a cursor of a sampling time sy1_b becomes a pre-cursor, a cursor of a sampling time sp2_b becomes a main cursor, a cursor of a sampling time sp3_b becomes a first post-cursor, and a cursor of a sampling time sp4_b becomes a second post-cursor. In general, in the case of the response signal sr_b, a cursor of the sampling time sp2_b becomes a pre-cursor, a cursor of the sampling time sp3_b becomes a main cursor, a cursor of the sampling time sp4_b becomes a first post-cursor, and a cursor of a sampling time sp5_b becomes a second post-cursor.

Hereinafter, a decoding method for a duo-binary signal will be described with reference to FIGS. 2 and 3.

A determination value of 1UI previous data may be utilized when decoding on a duo-binary signal is performed. When the determination value of the 1UI previous data is 1, a first reference voltage VH may be used when current data is determined. Also, when the determination value of the 1UI previous data is 0, a second reference voltage VL may be used when the current data is determined. The first reference voltage VH may have an intermediate value of the highest level HL and the intermediate level IL among the changeable levels of the reception signal. The second reference voltage VL may have an intermediate value of the lowest level LL and the intermediate level IL among the changeable levels of the reception signal.

In an example, referring to FIG. 2, because the determination value of the 1UI previous data is 0 at the sampling time sp2_a, the binary level of the current data may be determined based on the second reference voltage VL. The level of the reception signal sampled at the sampling time sp2_a is the intermediate level IL that is higher than the second reference voltage VL. Therefore, the binary level of the current data may be determined as 1.

Next, referring to FIG. 2, because the determination of the 1UI previous data is 1 at the sampling time sp3_a, the binary level of the current data may be determined based on the first reference voltage VH. The level of the reception signal sampled at the sampling time sp3_a is the intermediate level IL that is lower than the first reference voltage VH. Therefore, the binary level of the current data may be determined as 0.

In another example, referring to FIG. 3, because the determination of the 1UI previous data is 0 at the sampling time sp2_b, the binary level of the current data may be determined based on the second reference voltage VL. The level of the reception signal sampled at the sampling time sp2_b is the intermediate level IL that is higher than the second reference voltage VL. Therefore, the binary level of the current data may be determined as 1.

Next, referring to FIG. 3, because the determination of the 1UI previous data is 1 at the sampling time sp3_b, the binary level of the current data may be determined based on the first reference voltage VH. The level of the reception signal sampled at the sampling time sp3_b is the highest level HL that is higher than the first reference voltage VH. Therefore, the binary level of the current data may be determined as 1.

Next, referring to FIG. 3, because the determination of the 1UI previous data is 1 at the sampling time sp4_b, the binary level of the current data may be determined based on the first reference voltage VH. The level of the reception signal sampled at the sampling time sp4_b is the intermediate level IL that is lower than the first reference voltage VH. Therefore, the binary level of the current data may be determined as 0.

Figure 4:
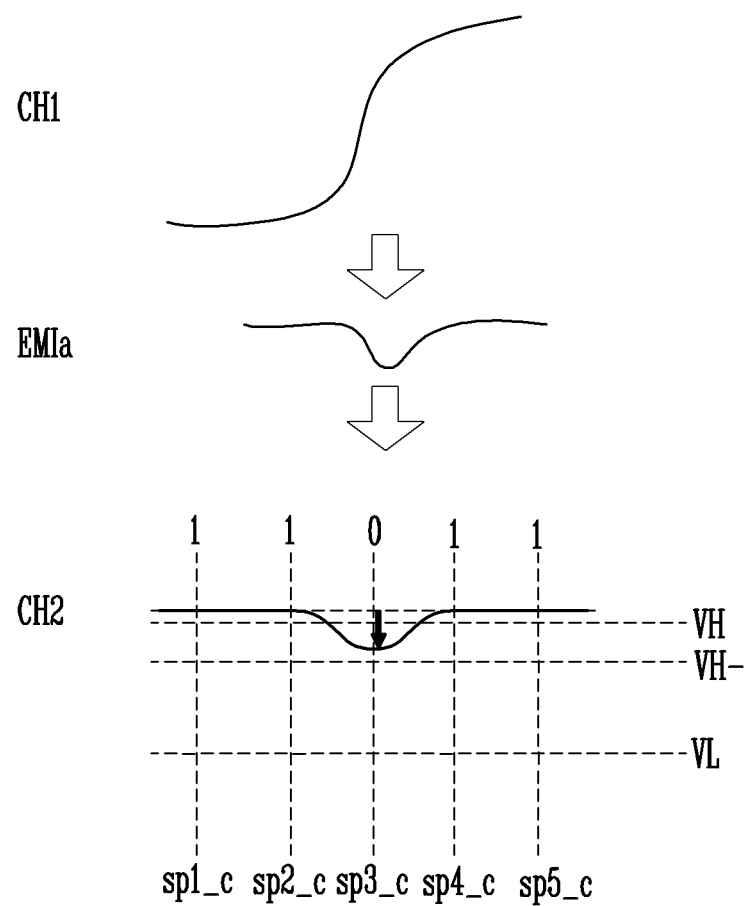
FIG. 4 is a diagram illustrating an example of crosstalk-induced glitch caused by an adjacent reception signal.
Figure 5:
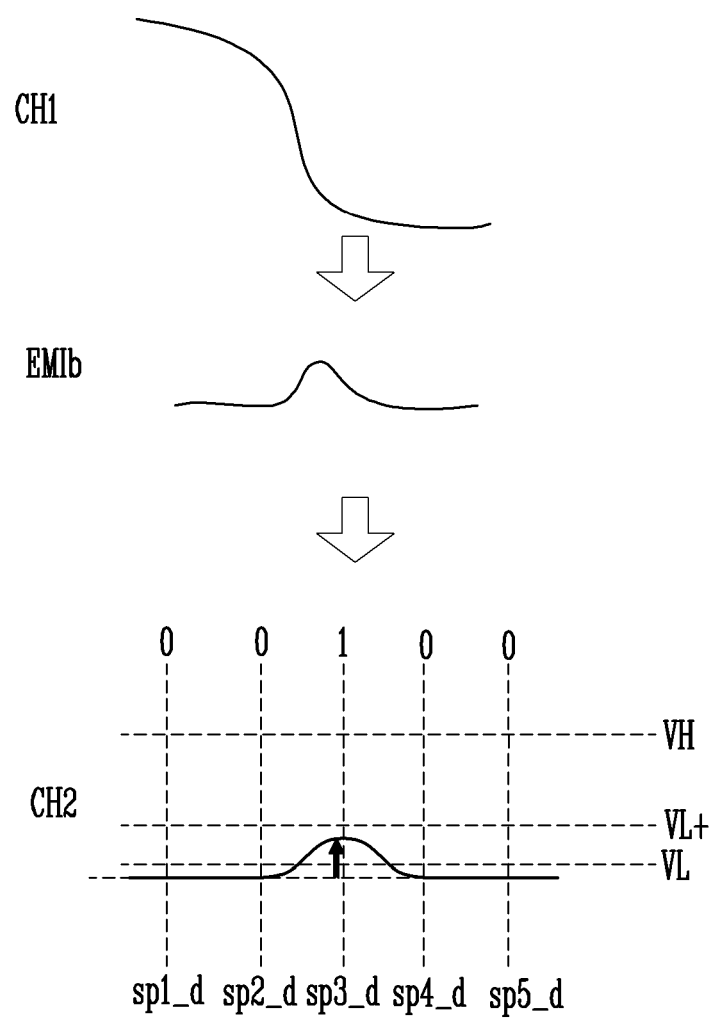
FIG. 5 is a diagram illustrating another example of the crosstalk-induced glitch caused by the adjacent reception signal.

FIG. 4 is a diagram illustrating an example of crosstalk-induced glitch caused by an adjacent reception signal. FIG. 5 is a diagram illustrating another example of the crosstalk-induced glitch caused by the adjacent reception signal.

When the crosstalk-induced glitch is described, a target channel is referred to as a victim channel, and an adjacent channel that has bad influence on the victim channel is referred to an aggressor channel. In this description, the victim channel as the target channel is assumed as a channel CH2, and the aggressor channel is assumed as a channel CH1. However, in FIGS. 10 to 13, the aggressor channel may include a plurality of channels CH1 and CH3.

Meanwhile, crosstalk-induced glitch induced in the channel CH2 may have bad influence on the channel CH1, and the bad influence may return to the channel CH2. The influence is relatively insignificant, and description is excessively complicated. Therefore, its description will be omitted.

Referring to FIG. 4, there is illustrated a case where a rising transition occurs in the aggressor channel CH1. A case where the transmitting unit TX2 is continuously transmitting a signal corresponding to the binary level 1 through the victim channel CH2 is assumed.

As described above, in order for the receiving unit RX2 to determine a binary level at each of sampling times sp1_c to sp5_c as 1, the reception signal has a level of the first reference voltage VH or higher at each of the sampling times sp1_c to sp5_c, which is ideal.

However, when a rising transition occurs in the aggressor channel CH1, electromagnetic interference EMIa is caused by mutual inductance between the two channels CH1 and CH2, and therefore, a voltage drop occurs in the victim channel CH2. The voltage drop may be referred to as crosstalk-induced glitch.

Therefore, the receiving unit RX2 may sample a reception signal having a level lower than the first reference voltage VH at a sampling time sp3_c at which the electromagnetic interference EMIa occurs. An error that the binary level of the reception signal at the sampling time sp3_c is determined as 0 occurs.

In the present disclosure, under a situation such as the sampling time sp3_c, a first correction reference voltage VH− is used instead of the first reference voltage VH, so that incidences of a sampling error caused by glitch can be prevented or reduced.

Referring to FIG. 5, there is illustrated a case where a falling transition occurs in the aggressor channel CH1. A case where the transmitting unit TX2 is continuously transmitting a signal corresponding to the binary level 0 through the victim channel CH2 is assumed.

As described above, in order for the receiving unit RX2 to determine a binary level at each of sampling times sp1_d to sp5_d as 0, the reception signal has a level of the second reference voltage VL or lower at each of the sampling times sp1_d to sp5_d, which is ideal.

However, when a falling transition occurs in the aggressor channel CH1, electromagnetic interference EMIb is caused by mutual inductance between the two channels CH1 and CH2, and therefore, a voltage rise occurs in the victim channel CH2. The voltage rise may be referred to as crosstalk-induced glitch.

Therefore, the receiving unit RX2 may sample a reception signal having a level higher than the second reference voltage VL at a sampling time sp3_d at which the electromagnetic interference EMIb occurs. An error that the binary level of the reception signal at the sampling time sp3_d is determined as 1 occurs.

In the present disclosure, under a situation such as the sampling time sp3_d, a second correction reference voltage VL+ is used instead of the second reference voltage VL, so that incidences of a sampling error caused by glitch can be prevented or reduced.

According to some example embodiments, the first correction reference voltage VH− may have a value between the first reference voltage VH and the second reference voltage VL, and the second correction reference voltage VL+ may have a value between the first reference voltage VH and the second reference voltage VL. The first correction reference voltage VH− may be larger than the second correction reference voltage VL+.

In some example embodiments, the first correction reference voltage VH− may be larger than the intermediate level IL, and the second correction reference voltage VL+ may be smaller than the intermediate level IL (see, e.g., FIGS. 2 and 3).

Figures 6, 7:
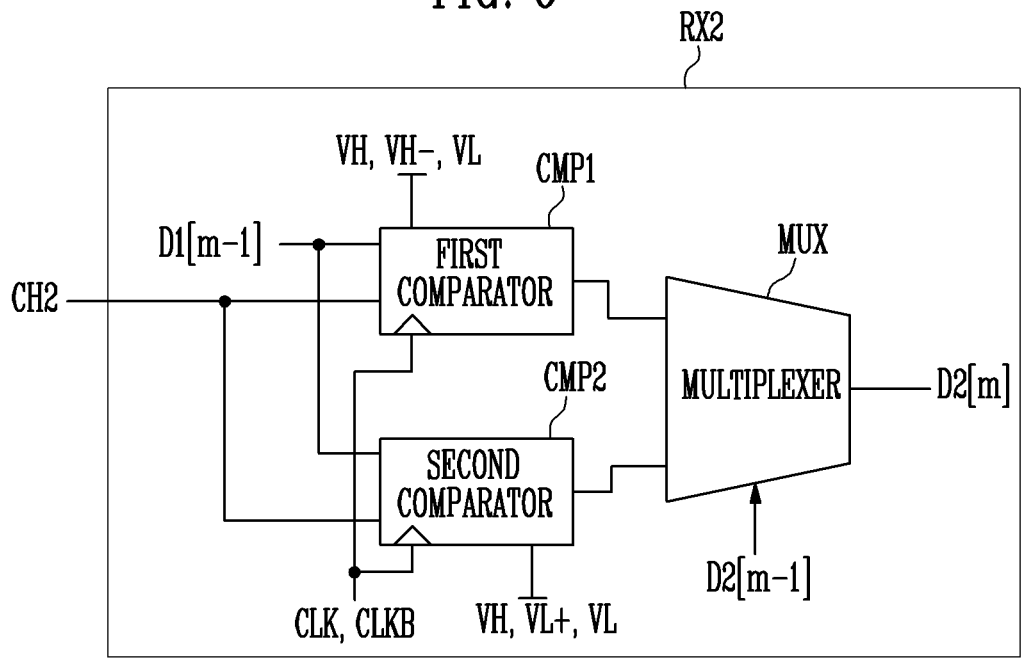
FIG. 6 is a diagram illustrating a receiving unit according to some example embodiments of the present disclosure.
FIG. 7 is a diagram illustrating a driving method of the receiving unit according to some example embodiments of the present disclosure.

FIG. 6 is a diagram illustrating a receiving unit according to some example embodiments of the present disclosure.

Although the receiving unit RX2 is illustrated based on the target channel CH2 in FIG. 6, the same contents may be applied to another channel and another receiving unit. Referring to FIG. 6, the receiving unit RX2 may include a first comparator CMP1, a second comparator CMP2, and a multiplexer MUX.

The first comparator CMP1 may select one of the first reference voltage VH and the first correction reference voltage VH−, based on a determination value D1[m−1] of data at a past time of at least one adjacent channel CH1, and compare the difference between the selected voltage and the second reference voltage VL with an input voltage at a current time of the target channel CH2.

When the current time is an mth UI (m is a natural number), the past time may be an (m−1)th UI. That is, the past time may be a 1UI previous time as compared with the current time. In some example embodiments, the past time may be a past time of 2UI time or more as compared with the current time.

The second comparator CMP may select one of the second reference voltage VL and the second correction reference voltage VL+, based on the determination value D1[m−1] of the data at the past time of the at least one adjacent channel CH1, and compare the difference between the selected voltage and the first reference voltage VH with the input voltage.

The multiplexer MUX may output one of an output value of the first comparator CMP1 and an output value of the second comparator CMP2 as a determination value D2[m] of data at a current time of the target channel CH2, based on a determination value D2[m−1] of data at a past time of the target channel CH2.

For example, when the determination value D2[m−1] at a 1UI previous time corresponds to the binary level 1, the multiplexer MUX may output the output value of the first comparator CMP1 as the determination value D2[m] at the current time. The output value of the second comparator CMP2 may be neglected.

In addition, when the determination value D2[m−1] at the 1UI previous time corresponds to the binary level 0, the multiplexer MUX may output the output value of the second comparator CMP2 as the determination value D2[m] at the current time. The output value of the first comparator CMP1 may be neglected.

FIG. 7 is a diagram illustrating a driving method of the receiving unit according to some example embodiments of the present disclosure.

As described above, when the determination value D2[m−1] of the data at the past time of the target channel CH2 corresponds to the binary level 1, the output value of the first comparator CMP1 may be used when the value D2[m] of the data at the current time of the target channel CH2 is determined.

As described above with reference to FIG. 4, when a rising transition occurs in the adjacent channel CH1, the first correction reference voltage VH− may be used instead of the first reference voltage VH. The rising transition at the current time of the adjacent channel CH1 may occur only when the determination value D1[m−1] of the data at the past time of the adjacent channel CH1 corresponds to the binary level 0.

Therefore, according to some example embodiments, when the determination value D1[m−1] of the data at the past time of the adjacent channel CH1 corresponds to the binary level 0, the first comparator CMP1 may compare the first correction reference voltage VH− and a sampling signal of the target channel CH2. In other cases, the first comparator CMP1 may compare the first reference voltage VH and the sampling signal of the target channel CH2.

As described above, when the determination value D2[m−1] of the data at the past time of the target channel CH2 corresponds to the binary level 0, the output value of the second comparator CMP2 may be used when the value D2[m] of the data at the current time of the target channel CH2 is determined.

As described above with reference to FIG. 5, when a falling transition occurs in the adjacent channel CH1, the second correction reference voltage VL+ may be used instead of the first reference voltage VH. The falling transition at the current time of the adjacent channel CH1 may occur only when the determination value D1[m−1] of the data at the past time of the adjacent channel CH1 corresponds to the binary level 1.

Therefore, according to some example embodiments, when the determination value D1[m−1] of the data at the past time of the adjacent channel CH1 corresponds to the binary level 1, the second comparator CMP2 may compare the second correction reference voltage VL+ and the sampling signal of the target channel CH2. In other cases, the second comparator CMP2 may compare the second reference voltage VL and the sampling signal of the target channel CH2.

Figure 8:
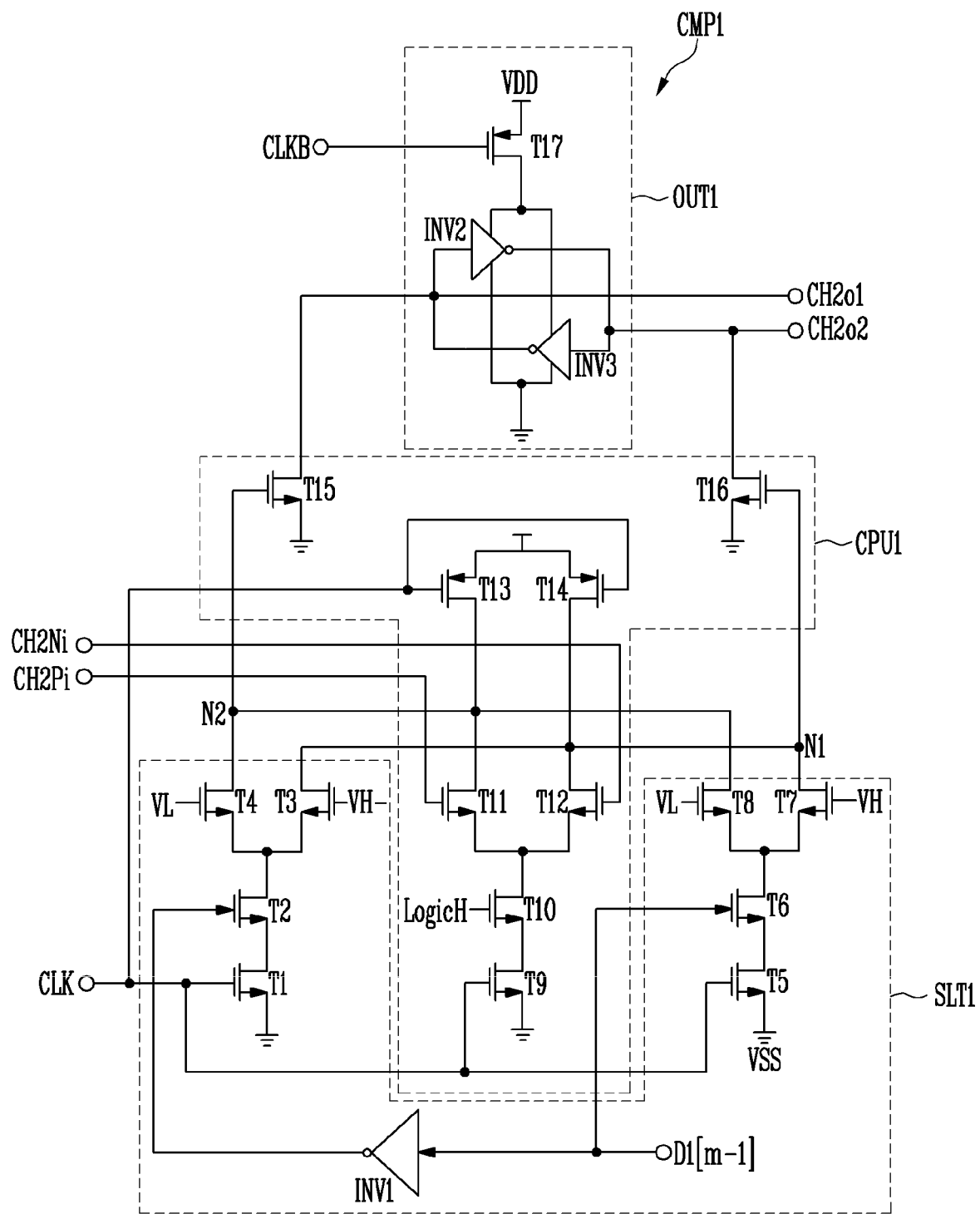
FIG. 8 is a diagram illustrating a first comparator according to some example embodiments of the present disclosure.

FIG. 8 is a diagram illustrating a first comparator according to some example embodiments of the present disclosure.

Referring to FIG. 8, the first comparator CMP1 according to some example embodiments of the present disclosure may include a first selector SLT1, a first comparator CPU1, and a first output unit OUT1.

The first selector SLT1 may include transistors T1 to T8 and a first inverter INV1. The transistors T1 to T8 may be implemented with an N-type transistor (e.g., an NMOS transistor).

The first inverter INV1 may invert the determination value D1[m−1] of the data at the past time of the adjacent channel CH1.

A clock signal CLK may be applied to a gate electrode of a first transistor T1, one electrode of the first transistor T1 may be connected to a first power source VSS, and the other electrode of the first transistor T1 may be connected to one electrode of a second transistor T2.

A gate electrode of the second transistor T2 may be connected to an output end of the first inverter INV1, the one electrode of the second transistor T2 may be connected to the other electrode of the first transistor T1, and the other electrode of the second transistor T2 may be connected to one electrode of a third transistor T3.

The first correction reference voltage VH− may be applied to a gate electrode of the third transistor T3, the one electrode of the third transistor T3 may be connected to the other electrode of the second transistor T2, and the other electrode of the third transistor T3 may be connected to a first node N1.

The second reference voltage VL may be applied to a gate electrode of a fourth transistor T4, one electrode of the fourth transistor T4 may be connected to the other electrode of the second transistor T2, and the other electrode of the fourth transistor T4 may be connected to a second node N2.

The clock signal CLK may be applied to a gate electrode of a fifth transistor T5, one electrode of the fifth transistor T5 may be connected to the first power source VSS, and the other electrode of the fifth transistor T5 may be one electrode of a sixth transistor T6.

The determination value D1[m−1] may be applied to a gate electrode of the sixth transistor T6, the one electrode of the sixth transistor T6 may be connected to the other electrode of the fifth transistor T5, and the other electrode of the sixth transistor T6 may be connected to one electrode of a seventh transistor T7.

The first reference voltage VH may be applied to a gate electrode of the seventh transistor T7, the one electrode of the seventh transistor T7 may be connected to the other electrode of the sixth transistor T6, and the other electrode of the seventh transistor T7 may be connected to the first node N1.

The second reference voltage VL may be applied to a gate electrode of an eighth transistor T8, one electrode of the eighth transistor T8 may be connected to the other electrode of the sixth transistor T6, and the other electrode of the eighth transistor T8 may be connected to the second node N2.

The first selector SLT1 may select one of the first reference voltage VH and the first correction reference voltage VH−, based on the determination value D1[m−1].

For example, when the determination value D1[m−1] corresponds to the binary level 1, the second transistor T2 may be turned off, and the sixth transistor T6 may be turned on. When the clock signal CLK having a high level is applied, the first node N1 may be connected to the first power source VSS through the transistors T7, T6, and T5, and the second node N2 may be connected to the first power source VSS through the transistors T8, T6, and T5. Therefore, the first reference voltage VH has influence on the discharge speed of the first node N1, and the second reference voltage VL has influence on the discharge speed of the second node N2.

When the determination value D1[m−1] corresponds to the binary level 0, the second transistor T2 may be turned on, and the sixth transistor T6 may be turned off. When the clock signal CLK having the high level having the high level is applied, the first node may be connected to the first power source VSS through the transistors T3, T2, and T1, and the second node N2 may be connected to the first power source VSS through the transistors T4, T2, and T1. Therefore, the first correction reference voltage VH− has influence on the discharge speed of the first node N1, and the second reference voltage VL has influence on the discharge speed of the second node N2.

The first comparator CPU1 may include transistors T9 to T16. Transistors T13 and T14 may be implemented with a P-type transistor (e.g., a PMOS transistor), and transistors T9, T10, T11, T12, T15, and T16 may be implemented with the N-type transistor.

The clock signal CLK may be applied to a gate electrode of a ninth transistor T9, one electrode of the ninth transistor T9 may be connected to the first power source VSS, and the other electrode of the ninth transistor T9 may be connected to one electrode of a tenth transistor T10.

A turn-on level voltage LogicH may be applied to a gate electrode of the tenth transistor T10, the one electrode of the tenth transistor T10 may be connected to the other electrode of the ninth transistor T9, and the other electrode of the tenth transistor T10 may be connected to one electrode of an eleventh transistor T11.

A first input voltage CH2Pi may be applied to a gate electrode of the eleventh transistor T11, the one electrode of the eleventh transistor T11 may be connected to the other electrode of the tenth transistor T10, and the other electrode of the eleventh transistor T11 may be connected to the second node N2.

A second input voltage CH2Ni may be applied to a gate electrode of a twelfth transistor T12, one electrode of the twelfth transistor T12 may be connected to the other electrode of the tenth transistor T10, and the other electrode of the twelfth transistor T12 may be connected to the first node N1.

The clock signal CLK may be applied to a gate electrode of a thirteenth transistor T13, one electrode of the thirteenth transistor T13 may be connected to the second node N2, and the other electrode of the thirteenth transistor T13 may be connected to a second power source VDD. The voltage level of the second power source VDD may be larger than that of the first power source VSS.

The clock signal CLK may be applied to a gate electrode of a fourteenth transistor T14, one electrode of the fourteenth transistor T14 may be connected to the first node N1, and the other electrode of the fourteenth transistor T14 may be connected to the second power source VDD.

A gate electrode of the fifteenth transistor T15 may be connected to the second node N2, one electrode of the fifteenth transistor T15 may be connected to the first power source VSS, and the other electrode of the fifteenth transistor T15 may be connected to a first output terminal CH2$o$1.

A gate electrode of a sixteenth transistor T16 may be connected to the first node N1, one electrode of the sixteenth transistor T16 may be connected to the first power source VSS, and the other electrode of the sixteenth transistor T16 may be connected to a second output terminal CH2$o$2.

The first comparator CPU1 may compare the difference between a voltage selected from the first reference voltage VH and the first correction reference voltage VH− and the second reference voltage VL with an input voltage at the current time of the target channel CH2.

In some embodiments, the input voltage is a differential signal and may include the first input voltage CH2Pi and the second input voltage CH2Ni. The first comparator CPU1 may compare the difference between the first input voltage CH2Pi and the second input voltage CH2Ni with the difference between the voltage selected from the first reference voltage VH and the first correction reference voltage VH− and the second reference voltage VL.

First, when the clock signal CLK has a low level, the thirteenth transistor T13 may be turned on to charge the second node N2 with the voltage of the second power source VDD. In addition, the fourteenth transistor T14 may be turned on to charge the first node N1 with the voltage of the second power source VDD.

Next, when the clock signal CLK has the high level, the second node N2 may be connected to the first power source VSS through the transistors T11, T10, and T9, and the first node N1 may be connected to the first power source VSS through the transistors T12, T10, and T9.

Referring to the description of the first selector SLT1, when the determination value D1[m−1] corresponds to the binary level 1, the discharge speed of the first node N1 increases when the magnitude of the first reference voltage VH and the second input voltage CH2Ni increases, and the discharge speed of the second node N2 increases when the magnitude of the second reference voltage VL and the first input voltage CH2Pi increases.

For example, at the sampling times sy1_$c$, sp2_$c$, sp4_$c$, and sp5_$c$ of FIG. 4, the following Equation 1 is satisfied, and therefore, the discharge speed of the second node N2 may be faster than that of the first node N1.

$$\text{CH2Pi}-\text{CH2Ni} > \text{VH}-\text{VL} \quad \text{Equation 1}$$

When the second node N2 is first discharged, the fifteenth transistor T15 may be turned off. Because the sixteenth transistor T16 is still in a turn-on state, the voltage of the first power source VSS is output to the second output terminal CH2$o$2, and the voltage of the second power source VDD is output to the first output terminal CH2$o$1 by inverters INV2 and INV3. A voltage of the first output terminal CH2$o$1 may be used as the output value of the first comparator CMP1. When the voltage of the second power source VDD is output from the first output terminal CH2$o$1, the output value of the first comparator CMP1 may be determined as the binary level 1.

However, as the value of CH2Pi-CH2Ni decreases due to the electromagnetic interference EMIa at the sampling time sp3_$c$ of FIG. 4, Equation 1 may not be satisfied. The discharge speed of the first node N1 is faster than that of the second node N2, and therefore, the first comparator CMP1 may output the binary level 0.

Thus, according to some example embodiments, the following Equation 2 is satisfied at the sampling time sp3_$c$ of FIG. 4, so that the first comparator CMP1 can output the binary level 1 in spite of the electromagnetic interference EMIa.

$$\text{CH2Pi}-\text{CH2Ni} > (\text{VH}-)-\text{VL} \quad \text{Equation 2}$$

According to Equation 2, although the value of CH2Pi-CH2Ni decreases due to the electromagnetic interference EMIa at the sampling time sp3_$c$, the value of (VH−)-VL also decreases as compared with the value of VH-VL, and therefore, Equation 2 may be satisfied.

The first output unit OUT1 may include a seventeenth transistor T11 and the inverters INV2 and INV3. The seventeenth transistor T17 may be implemented with the P-type transistor.

An input end of a second inverter INV2 may be connected to the first output terminal CH2$o$1, and an output end of the second inverter INV2 may be connected to the second output terminal CH2$o$2.

An input end of a third inverter INV3 may be connected to the second output terminal CH2o2, and an output end of the third inverter INV3 may be connected to the first output terminal CH2o1.

An inverting signal CLKB of the clock signal CLK may be applied to a gate electrode of the seventeenth transistor T17, one electrode of the seventeenth transistor T17 may be connected to a power source terminal of the second inverter INV2 and a power source terminal of the third inverter INV3, and the other electrode of the seventeenth transistor T17 may be connected to the second power source VDD.

The first output unit OUT1 may determine an output voltage at the current time of the target channel CH2, based on the comparison result of the first comparator CPU1. The output voltage may correspond to at least one of a voltage applied to the first output terminal CH2o1 and a voltage applied to the second output terminal CH2o2. For example, according to some example embodiments, the voltage applied to the first output terminal CH2o1 is described as the output voltage. However, according to some example embodiments, the voltage applied to the second output terminal CH2o2 may be used as the output voltage. Also, according to some example embodiments, the difference between the voltage applied to the first output terminal CH2o1 and the voltage applied to the second output terminal CH2o2 may be used as the output voltage.

The first output unit OUT1 may serve as a latch. For example, when the inverting clock signal CLKB has the high level, the transistor T17 may be turned on to maintain the voltages of the output terminals CH2o1 and CH2o2.

Figure 9:
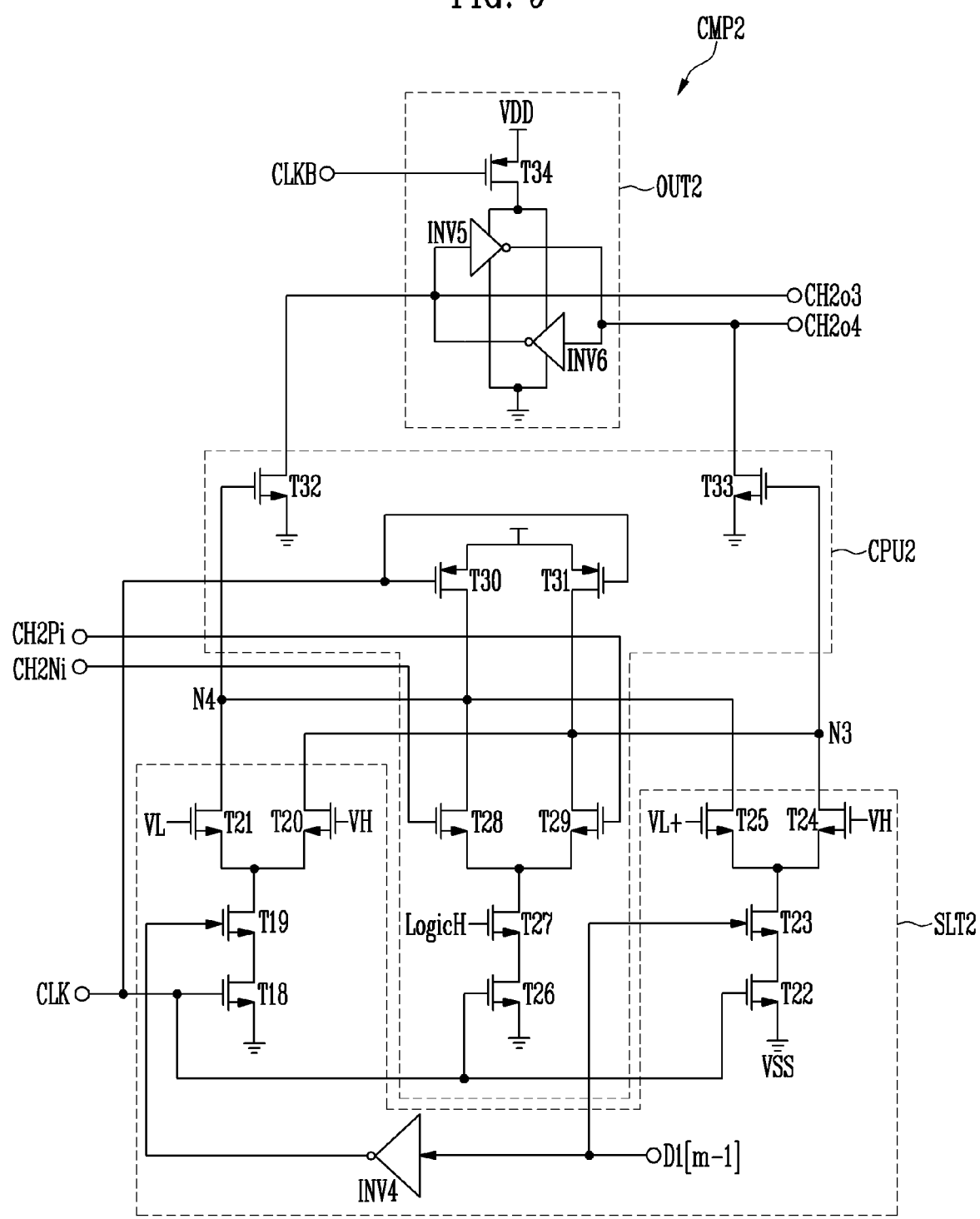
FIG. 9 is a diagram illustrating a second comparator according to some example embodiments of the present disclosure.

FIG. 9 is a diagram illustrating a second comparator according to some example embodiments of the present disclosure.

Referring to FIG. 9, the second comparator CMP2 according to some example embodiments of the present disclosure may include a second selector SLT2, a second comparator CPU2, and a second output unit OUT2.

The second selector SLT2 may include transistors T18 to T25 and a fourth inverter INV4. The transistors T18 to T25 may be implemented with the N-type transistor.

The fourth inverter INV4 may invert the determination value D1[m−1] of the data at the past time of the adjacent channel CH1.

The clock signal CLK may be applied to a gate electrode of an eighteenth transistor T18, one electrode of the eighteenth transistor T18 may be connected to the first power source VSS, and the other electrode of the eighteenth transistor T18 may be connected to one electrode of a nineteenth transistor T19.

A gate electrode of the nineteenth transistor T19 may be connected to an output end of the fourth inverter INV4, the one end of the nineteenth transistor T19 may be connected to the other electrode of the eighteenth transistor T18, and the other electrode of the nineteenth transistor T19 may be connected to one electrode of a twentieth transistor T20.

The first reference voltage VH may be applied to a gate electrode of the twentieth transistor T20, the one electrode of the twentieth transistor T20 may be connected to the other electrode of the nineteenth transistor T19, and the other electrode of the twentieth transistor T20 may be connected to a third node N3.

The second reference voltage VL may be applied to a gate electrode of a twenty-first transistor T21, one electrode of the twenty-first transistor T21 may be connected to the other electrode of the nineteenth transistor T19, and the other electrode of the twenty-first transistor T21 may be connected to a fourth node N4.

The clock signal CLK may be applied to a gate electrode of the twenty-second transistor T22, one electrode of the twenty-second transistor T22 may be connected to the first power source VSS, and the other electrode of the twenty-second transistor T22 may be connected to one electrode of a twenty-third transistor T23.

The determination value D1[m−1] may be applied to a gate electrode of the twenty-third transistor T23, the one electrode of the twenty-third transistor T23, and the other electrode of the twenty-third transistor T23 may be connected to one electrode of a twenty-fourth transistor T24.

The first reference voltage VH may be applied to a gate electrode of the twenty-fourth transistor T24, the one electrode of the twenty-fourth transistor T24 may be connected to the other electrode of the twenty-third transistor T23, and the other electrode of the twenty-fourth transistor T24 may be connected to the third node N3.

The second correction reference voltage VL+ may be applied to a gate electrode of a twenty-fifth transistor T25, one electrode of the twenty-fifth transistor T25 may be connected to the other electrode of the twenty-third transistor T23, and the other electrode of the twenty-fifth transistor T25 may be connected to the fourth node N4.

The second selector SLT2 may select one of the second reference voltage VL and the second correction reference voltage VL+, based on the determination value D1[m−1].

For example, the determination value D1[m−1] corresponds to the binary level 1, the nineteenth transistor T19 may be turned off, and the twenty-third transistor T23 may be turned on. When the clock signal CLK having the high level is applied, the third node N3 may be connected to the first power source VSS through the transistors T24, T23, and T22, and the fourth node N4 may be connected to the first power source VSS through the transistors T25, T23, and T22. Therefore, the first reference voltage VH has influence on the discharge speed of the third node N3, and the second correction reference voltage VL+ has influence on the discharge speed of the fourth node N4.

When the determination value D1[m−1] corresponds to the binary level 0, the nineteenth transistor T19 may be turned on, and the twenty-third transistor T23 may be turned off. When the clock signal CLK having the high level is applied, the third nod N3 may be connected to the first power source VSS through the transistors T20, T19, and T18, and the fourth node N4 may be connected to the first power source VSS through the transistors T21, T19, and T18. Therefore, the first reference voltage VH has influence on the discharge speed of the third node N3, and the second reference voltage VL has influence on the discharge speed of the fourth node N4.

The second comparator CPU2 may include transistors T26 to T33. Transistors T30 and T31 may be implemented with the P-type transistor, and transistors T26, T27, T28, T29, T32, and T33 may be implemented with the N-type transistor.

The clock signal CLK may be applied to a gate electrode of a twenty-sixth transistor T26, one electrode of the twenty-sixth transistor T26 may be connected to the first power source VSS, and the other electrode of the twenty-sixth transistor T26 may be connected to one electrode of a twenty-seventh transistor T27.

The turn-on level voltage LogicH may be applied to a gate electrode of the twenty-seventh transistor T27, the one electrode of the twenty-seventh transistor T27 may be connected to the other electrode of the twenty-sixth transistor T26, and the other electrode of the twenty-seventh transistor T27 may be connected to one electrode of a twenty-eighth transistor T28.

The second input voltage CH2Ni may be applied to a gate electrode of the twenty-eighth transistor T28, the one electrode of the twenty-eighth transistor T28 may be connected to the other electrode of the twenty-seventh transistor T27, and the other electrode of the twenty-eighth transistor T28 may be connected to the fourth node N4.

The first input voltage CH2Pi may be applied to a twenty-ninth transistor T29, one electrode of the twenty-ninth transistor T29 may be connected to the other electrode of the twenty-seventh transistor T27, and the other electrode of the twenty-ninth transistor T29 may be connected to the third node N3.

The clock signal CLK may be applied to a gate electrode of a thirtieth transistor T30, one electrode of the thirtieth transistor T30 may be connected to the fourth node N4, and the other electrode of the thirtieth transistor T30 may be connected to the second power source VDD. The voltage level of the second power source may be larger than that of the first power source VSS.

The clock signal CLK may be applied to a gate electrode of a thirty-first transistor T31, one electrode of the thirty-first transistor T31 may be connected to the third node N3, and the other electrode of the thirty-first transistor T31 may be connected to the second power source VDD.

A gate electrode of a thirty-second transistor T32 may be connected to the fourth node N4, one electrode of the thirty-second transistor T32 may be connected to the first power source VSS, and the other electrode of the thirty-second transistor T32 may be connected to a third output terminal CH2o3.

A gate electrode of a thirty-third transistor T33 may be connected to the third node N3, one electrode of the thirty-third transistor T33 may be connected to the first power source VSS, and the other electrode of the thirty-third transistor T33 may be connected to a fourth output terminal CH2o4.

The second comparator CPU2 may compare the difference between a voltage selected from the second reference voltage VL and the second correction reference voltage VL+ and the first reference voltage VH with an input voltage at the current time of the target channel CH2.

In some example embodiments, the input voltage is a differential signal, and may include the first input voltage CH2Pi and the second input voltage CH2Ni. The second comparator CPU2 may compare the difference between the first input voltage CH2Pi and the second input voltage CH2Ni with the difference between the voltage selected from the second reference voltage VL and the second correction reference voltage VL+ and the first reference voltage VH.

First, when the clock signal CLK has the low level, the thirtieth transistor T30 may be turned on to charge the fourth node N4 with the voltage of the second power source VDD. In addition, the thirty-first transistor T31 may be turned on to charge the third node N3 with the voltage of the second power source VDD.

Next, when the clock signal CLK has the high level, the fourth node N4 may be connected to the first power source VSS through the transistors T28, T27, and T26, and the first node N1 may be connected to the first power source VSS through the transistors T29, T27, and T26.

Referring to description of the second selector SLT2, when the determination value D1[m−1] corresponds to the binary level 0, the discharge speed of the third node N3 increases when the magnitude of the first reference voltage VH and the first input voltage CH2Pi increases, and the discharge speed of the fourth node N4 increases when the magnitude of the second reference voltage VL and the second input voltage CH2Ni increases.

For example, at the sampling times sy1_d, sp2_d, sp4_d, and sp5_d of FIG. 5, the following Equation 3 is satisfied, and therefore, the discharge speed of the fourth node N4 may be faster than that of the third node N3.

$$CH2Ni-CH2Pi>VH-VL \qquad \text{Equation 3}$$

When the fourth node N4 is first discharged, the thirty-second transistor T32 may be turned off. Because the thirty-third transistor T33 is still in the turn-on state, the voltage of the first power source VSS is output to the fourth output terminal CH2o4, and the voltage of the second power source VDD is output to the third output terminal CH2o3 by inverters INV5 and INV6. A voltage of the fourth output terminal CH2o4 may be used as the output value of the second comparator CMP2. When the voltage of the first power source VSS is output from the fourth output terminal CH2o4, the output value of the second comparator CMP2 may be determined as the binary level 0.

However, as the value of CH2Ni-CH2Pi decreases due to the electromagnetic interference EMIb at the sampling time sp3_d of FIG. 5, Equation 3 may not be satisfied. The discharge speed of the third node N3 is faster than that of the fourth node N4, and therefore, the second comparator CMP2 may output the binary level 1.

Thus, according to some example embodiments, the following Equation 4 is satisfied at the sampling time sp3_d of FIG. 5, so that the second comparator CMP2 can output the binary level 0 in spite of the electromagnetic interference EMIb.

$$CH2Ni-CH2Pi>VH-(VL+) \qquad \text{Equation 4}$$

According to Equation 4, although the value of CH2Ni-CH2Pi decreases due to the electromagnetic interference EMIb at the sampling time sp3_d, the value of VH− (VL+) also decreases as compared with the value of VH−VL, and therefore, Equation 4 may be satisfied.

The second output unit OUT2 may include a thirty-fourth transistor T34 and the inverters INV5 and INV6. The thirty-fourth transistor T34 may be implemented with the P-type transistor.

An input end of a fifth inverter INV5 may be connected to the third output terminal CH2o3, and an output end of the fifth inverter INV5 may be connected to the fourth output terminal CH2o4.

An input end of a sixth inverter INV6 may be connected to the fourth output terminal CH2o4, and an output end of the sixth inverter INV6 may be connected to the third output terminal CH2o3.

The inverting signal CLKB of the clock signal CLK may be applied to a gate electrode of the thirty-fourth transistor T34, one electrode of the thirty-fourth transistor T34 may be connected to a power source terminal of the fifth inverter INV5 and a power source terminal of the sixth inverter INV6, and the other electrode of the thirty-fourth transistor T34 may be connected to the second power source VDD.

The second output unit OUT2 may determine an output voltage at the current time of the target channel CH2, based on the comparison result of the second comparator CPU2. The output voltage may correspond to at least one of a voltage applied to the third output terminal CH2o3 and a voltage applied to the fourth output terminal CH2o4. For example, according to some example embodiments, the voltage applied to the fourth output terminal CH2o4 is described as the output voltage. However, according to some example embodiments, the voltage applied to the third output terminal CH2o3 may be used as the output voltage. Also, according to some example embodiments, the difference between the voltage applied to the third output terminal CH2o3 and the voltage applied to the fourth output terminal CH2o4 may be used as the output voltage.

The second output unit OUT2 may serve as a latch. For example, when the inverting clock signal CLKB has the high level, the transistor T34 may be turned on to maintain the voltages of the output terminals CH2o3 and CH2o4.

Figures 10, 11:
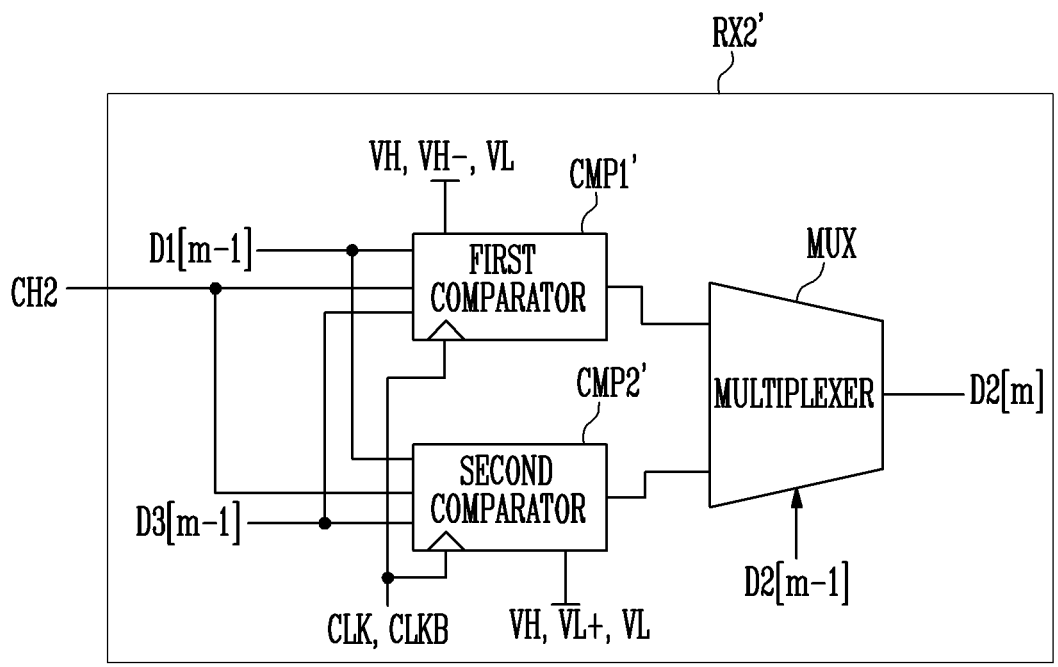
FIG. 10 is a diagram illustrating a receiving unit according to some example embodiments of the present disclosure.
FIG. 11 is a diagram illustrating a driving method of the receiving unit according to some example embodiments of the present disclosure.

FIG. 10 is a diagram illustrating a receiving unit according to some example embodiments of the present disclosure.

Referring to FIG. 10, the receiving unit RX2' is different from the receiving unit RX2 in that first and second comparators CMP1' and CMP2 refer to not only the determination value D1[m−1] of the data at the past time of the adjacent channel CH1 but also a determination value D3[m−1] of data at a past time of an adjacent channel CH3.

Referring to FIG. 1, a physical distance between the target channel CH2 and the adjacent channel CH3 may be similar to that between the target channel CH2 and the adjacent channel CH1. That is, the adjacent channels CH1 and CH3 correspond to channels most adjacent to the target channel CH2, and provide the largest electrical interference to the target channel CH2.

Therefore, the receiving unit RX2' of this embodiment may be designed to consider not only electromagnetic interference with respect to the adjacent channel CH1 but also electromagnetic interference with respect to the adjacent channel CH3.

FIG. 11 is a diagram illustrating a driving method of the receiving unit according to some example embodiments of the present disclosure.

Referring to FIG. 11, when the determination values D1[m−1] and D3[m−1] of the data at the past times of the adjacent channels CH1 and CH3 correspond to the binary level 0, the first comparator CMP1' may compare the first correction reference voltage VH− and the sampling signal of the target channel CH2. In the other cases, the first comparator CMP1' may compare the first reference voltage VH and the sampling signal of the target channel CH2.

In addition, when the determination values D1[m−1] and D3[m−1] of the data at the past times of the adjacent channels CH1 and CH3 correspond to the binary level 1, the second comparator CMP2' may compare the second correction reference voltage VL+ and the sampling signal of the target channel CH2. In the other cases, the second comparator CMP2' may compare the second reference voltage VL and the sampling signal of the target channel CH2.

Figure 12:
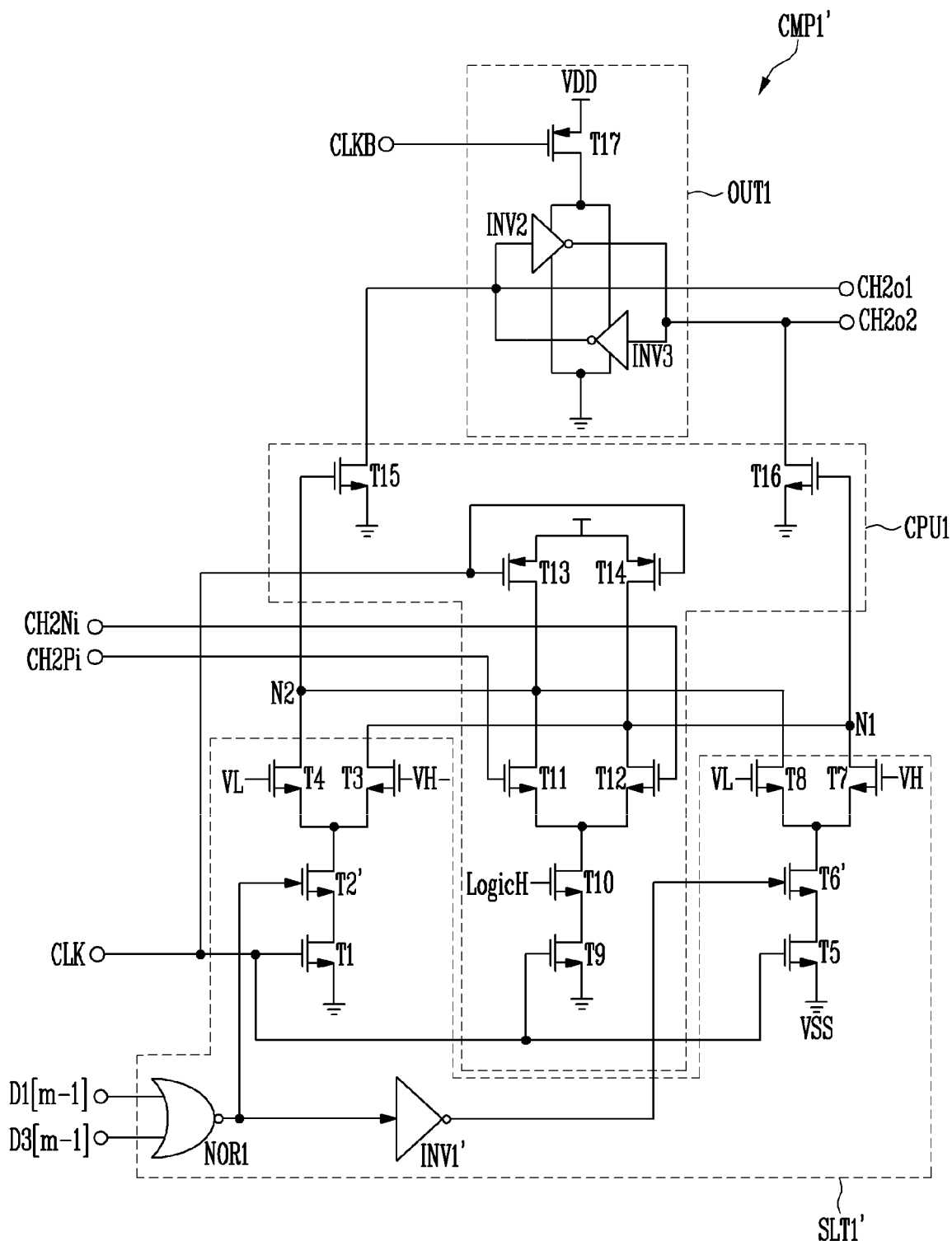
FIG. 12 is a diagram illustrating a first comparator according to some example embodiments of the present disclosure.

FIG. 12 is a diagram illustrating a first comparator according to some example embodiments of the present disclosure.

Referring to FIG. 12, the first comparator CMP1' is substantially identical to the first comparator CMP1, except that a first selector SLT1' further includes a first NOR gate NOR1, and the connection configuration of a first inverter INV1' and transistors T2' and T6' is changed. Therefore, overlapping descriptions will be omitted.

The first selector SLT1' may select one of the first reference voltage VH and the first correction reference voltage VH−, based on the determination value D1[m−1] of the data at the past time of the adjacent channel CH1 and the determination value D3[m−1] of the data at the past time of the adjacent channel CH3.

The first NOR gate NOR1 may receive the determination value D1[m−1] and the determination value D3[m−1].

An output value of the first NOR gate NOR1 may be applied to a gate electrode of a second transistor T2', one electrode of the second transistor T2' may be connected to the other electrode of the first transistor T1, and the other electrode of the second transistor T2' may be connected to the one electrode of the third transistor T3.

The first inverter INV1' may invert the output value of the first NOR gate NOR1.

A gate electrode of a sixth transistor T6' may be connected to an output end of the first inverter INV1', one electrode of the sixth transistor T6' may be connected to the other electrode of the fifth transistor T5, and the other electrode of the sixth transistor T6' may be connected to the one electrode of the seventh transistor T7.

Figure 13:
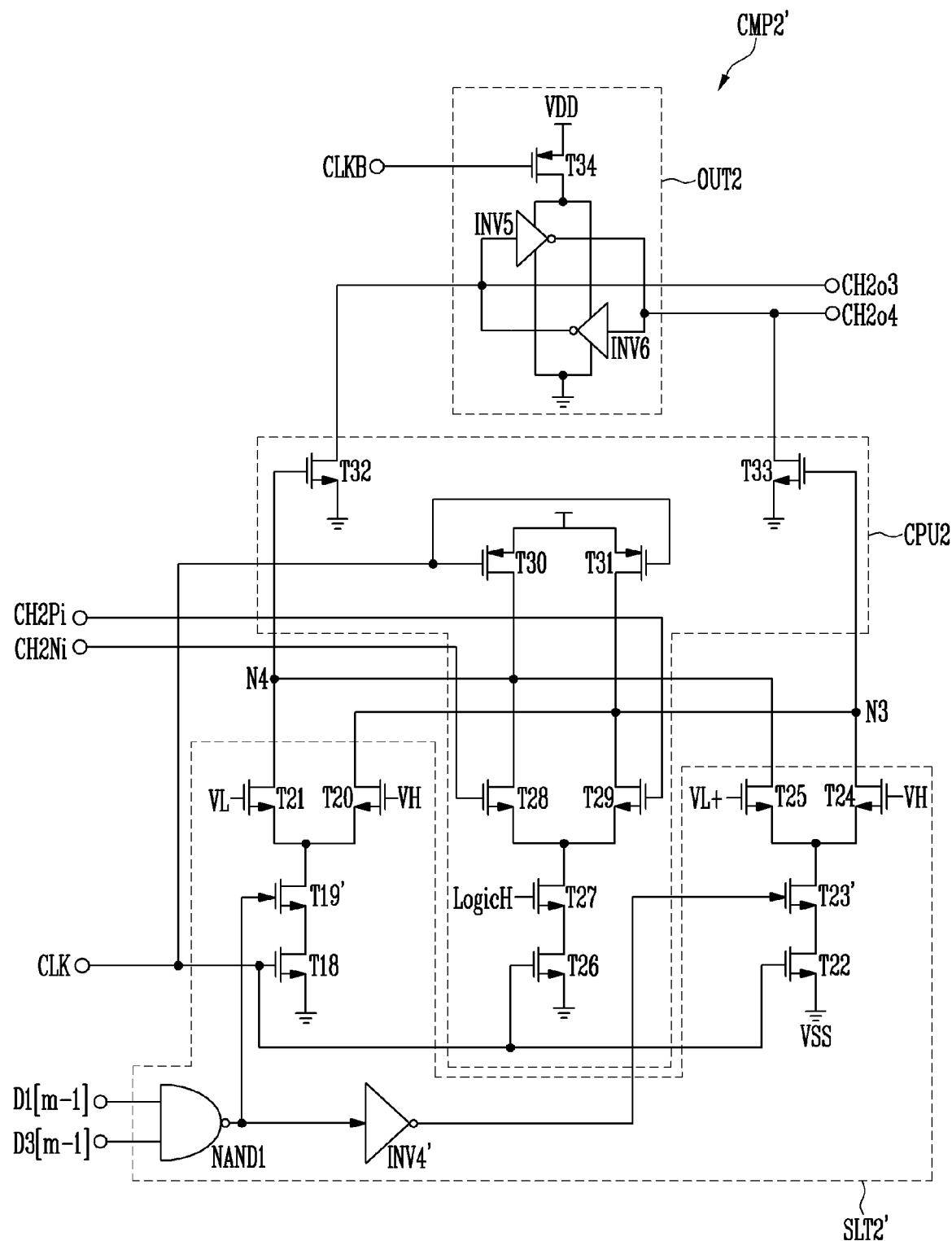
FIG. 13 is a diagram illustrating a second comparator according to some example embodiments of the present disclosure.

FIG. 13 is a diagram illustrating a second comparator according to some example embodiments of the present disclosure.

Referring to FIG. 13, the second comparator CMP2' is substantially identical to the second comparator CMP2, except that a second selector SLT2' further includes a first NAND gate NAND1, and the connection configuration of a fourth inverter INV4' and transistors T19' and T23' is changed. Therefore, overlapping descriptions will be omitted.

The first NAND gate NAND1 may receive the determination value D1[m−1] and the determination value D3[m−1].

The fourth inverter INV4' may invert an output value of the first NAND gate NAND1.

The output value of the first NAND gate NAND1 may be applied to a gate electrode of a nineteenth transistor T19', one electrode of the nineteenth transistor T19' may be connected to the other electrode of the eighteenth transistor T18, and the other electrode of the nineteenth transistor T19' may be connected to the one electrode of the twentieth transistor T20.

A gate electrode of a twenty-third transistor T23' may be connected to an output end of the fourth inverter INV4', one electrode of the twenty-third transistor T23' may be connected to the other electrode of the twenty-second transistor T22, and the other electrode of the twenty-third transistor T23' may be connected to the one electrode of the twenty-fourth T24.

In the comparator and the receiver including the same according to the present disclosure, the influence of crosstalk caused by an adjacent channel can be minimized or reduced.

Aspects of some example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims and their equivalents.

What is claimed is:

1. A comparator comprising:
a first selector configured to select one of a first reference voltage and a first correction reference voltage, based on a first determination value of data at a past time of a first adjacent channel;
a first comparator configured to compare a difference between a voltage selected from the first reference voltage and the first correction reference voltage, and a second reference voltage, with an input voltage at a current time of a target channel, wherein the input voltage is a differential signal comprising a first input voltage and a second input voltage; and
a first output unit configured to determine an output voltage at the current time of the target channel, based on a comparison result of the first comparator.

2. The comparator of claim 1, wherein the input voltage is a differential signal and includes a first input voltage and a second input voltage,
wherein the first comparator is configured to compare the difference between the first input voltage and the second input voltage with the difference between the voltage selected from the first reference voltage and the first correction reference voltage and the second reference voltage.

3. The comparator of claim 2, further comprising:
a second selector configured to select one of the second reference voltage and a second correction reference voltage, based on the first determination value;
a second comparator configured to compare the difference between a voltage selected from the second reference voltage and the second correction reference voltage and the first reference voltage with the input voltage; and
a second output unit configured to determine an output voltage at the current time of the target channel, based on a comparison result of the second comparator.

4. The comparator of claim 3, wherein the first correction reference voltage has a value between the first reference voltage and the second reference voltage, and
the second correction reference voltage has a value between the first reference voltage and the second reference voltage,
wherein the first correction reference voltage is larger than the second correction reference voltage.

5. The comparator of claim 4, wherein the first selector includes:
a first inverter configured to invert the first determination value;
a first transistor having a gate electrode configured to receive a clock signal and one electrode connected to a first power source;
a second transistor having a gate electrode connected to an output end of the first inverter and one electrode connected to the other electrode of the first transistor;
a third transistor having a gate electrode configured to receive the first correction reference voltage, one electrode connected to the other electrode of the second transistor, and the other electrode connected to a first node; and
a fourth transistor having a gate electrode configured to receive the second reference voltage, one electrode connected to the other electrode of the second transistor, and the other electrode connected to a second node.

6. The comparator of claim 5, wherein the first selector further includes:
a fifth transistor having a gate electrode configured to receive the clock signal and one electrode connected to the first power source;
a sixth transistor having a gate electrode configured to receive the first determination value and one electrode connected to the other electrode of the fifth transistor;
a seventh transistor having a gate electrode configured to receive the first reference voltage, one electrode connected to the other electrode of the sixth transistor, and the other electrode connected to the first node; and
an eighth transistor having a gate electrode configured to receive the second reference voltage, one electrode connected to the other electrode of the sixth transistor, and the other electrode connected to the second node.

7. The comparator of claim 6, wherein the first comparator includes:
a ninth transistor having a gate electrode configured to receive the clock signal and one electrode connected to the first power source;
a tenth transistor having a gate electrode configured to receive a turn-on level voltage and one electrode connected to the other electrode of the ninth transistor;
an eleventh transistor having a gate electrode configured to receive the first input voltage, one electrode connected to the other electrode of the tenth transistor, and the other electrode connected to the second node; and
a twelfth transistor having a gate electrode configured to receive the second input voltage, one electrode connected to the other electrode of the tenth transistor, and the other electrode connected to the first node.

8. The comparator of claim 7, wherein the first comparator further includes:
a thirteenth transistor having a gate electrode configured to receive the clock signal, one electrode connected to the second node, and the other electrode connected to a second power source;
a fourteenth transistor having a gate electrode configured to receive the clock signal, one electrode connected to the first node, and the other electrode connected to the second power source;
a fifteenth transistor having a gate electrode connected to the second node, one electrode connected to the first power source, and the other electrode connected to a first output terminal; and
a sixteenth transistor having a gate electrode connected to the first node, one electrode connected to the first power source, and the other electrode connected to a second output terminal.

9. The comparator of claim 8, wherein the first output unit includes:
a second inverter having an input end connected to the first output terminal and an output end connected to the second output terminal;
a third inverter having an input end connected to the second output terminal and an output end connected to the first output terminal; and
a seventeenth transistor having a gate electrode configured to receive an inverting signal of the clock signal, one electrode connected to a power terminal of the second inverter and a power terminal of the third inverter, and the other electrode connected to the second power source.

10. The comparator of claim 9, wherein the second selector includes:
a fourth inverter configured to invert the first determination value;

an eighteenth transistor having a gate electrode configured to receive the clock signal and one electrode connected to the first power source;

a nineteenth transistor having a gate electrode connected to an output end of the fourth inverter and one electrode connected to the other electrode of the eighteenth transistor;

a twentieth transistor having a gate electrode configured to receive the first reference voltage, one electrode connected to the other electrode of the nineteenth transistor, and the other electrode connected to a third node; and a twenty-first transistor having a gate electrode configured to receive the second reference voltage, one electrode connected to the other electrode of the nineteenth transistor, and the other electrode connected to a fourth node.

11. The comparator of claim 10, wherein the second selector further includes:

a twenty-second transistor having a gate electrode configured to receive the clock signal and one electrode connected to the first power source;

a twenty-third transistor having a gate electrode configured to receive the first determination value and one electrode connected to the other electrode of the twenty-second transistor;

a twenty-fourth transistor having a gate electrode configured to receive the first reference voltage, one electrode connected to the other electrode of the twenty-third transistor, and the other electrode connected to the third node; and a twenty-fifth transistor having a gate electrode configured to receive the second correction reference voltage, one electrode connected to the other electrode of the twenty-third transistor, and the other electrode connected to the fourth node.

12. The comparator of claim 11, wherein the second comparator includes:

a twenty-sixth transistor having a gate electrode configured to receive the clock signal and one electrode connected to the first power source;

a twenty-seventh transistor having a gate electrode configured to receive the turn-on level voltage and one electrode connected to the other electrode of the twenty-sixth transistor;

a twenty-eighth transistor having a gate electrode configured to receive the second input voltage, one electrode connected to the other electrode of the twenty-seventh transistor, and the other electrode connected to the fourth node; and a twenty-ninth transistor having a gate electrode configured to receive the first input voltage, one electrode connected to the other electrode of the twenty-seventh transistor, and the other electrode connected to the third node.

13. The comparator of claim 12, wherein the second comparator further includes:

a thirtieth transistor having a gate electrode configured to receive the clock signal, one electrode connected to the fourth node, and the other electrode connected to the second power source;

a thirty-first transistor having a gate electrode configured to receive the clock signal, one electrode connected to the third node, and the other electrode connected to the second power source;

a thirty-second transistor having a gate electrode connected to the fourth node, one electrode connected to the first power source, and the other electrode connected to a third output terminal; and a thirty-third transistor having a gate electrode connected to the third node, one electrode connected to the first power source, and the other electrode connected to a fourth output terminal.

14. The comparator of claim 13, wherein the second output unit includes:

a fifth inverter having an input end connected to the third output terminal and an output end connected to the fourth output terminal;

a sixth inverter having an input end connected to the fourth output terminal and an output end connected to the third output terminal; and a thirty-fourth transistor having a gate electrode configured to receive the inverting signal of the clock signal, one electrode connected to a power terminal of the fifth inverter and a power terminal of the sixth inverter, and the other electrode connected to the second power source.

15. A comparator comprising:

a first selector configured to select one of a first reference voltage and a first correction reference voltage, based on a first determination value of data at a past time of a first adjacent channel and a second determination value of data at a past time of a second adjacent channel;

a first comparator configured to compare a difference between a voltage selected from the first reference voltage and the first correction reference voltage, and a second reference voltage, with an input voltage at a current time of a target channel, wherein the input voltage is a differential signal comprising a first input voltage and a second input voltage; and a first output unit configured to determine an output voltage at the current time of the target channel, based on a comparison result of the first comparator.

16. The comparator of claim 15, further comprising:

a second selector configured to select one of the second reference voltage and a second correction reference voltage, based on the first determination value and the second determination value;

a second comparator configured to compare a difference between a voltage selected from the second reference voltage and the second correction reference voltage and the first reference voltage with the input voltage; and a second output unit configured to determine an output voltage at the current time of the target channel, based on a comparison result of the second comparator.

17. The comparator of claim 16, wherein the first selector includes:

a first NOR gate configured to receive the first determination value and the second determination value;

a first transistor having a gate electrode configured to receive a clock signal and one electrode connected to a first power source;

a second transistor having a gate electrode configured to receive an output value of the first NOR gate and one electrode connected to the other electrode of the first transistor;

a third transistor having a gate electrode configured to receive the first correction reference voltage, one electrode connected to the other electrode of the second transistor, and the other electrode connected to a first node;

a fourth transistor having a gate electrode configured to receive the second reference voltage, one electrode connected to the other electrode of the second transistor, and the other electrode connected to a second node;

a first inverter inverting the output value of the first NOR gate;

a fifth transistor having a gate electrode configured to receive the clock signal and one electrode connected to the first power source;

a sixth transistor having a gate electrode connected to an output end of the first inverter and one electrode connected to the other electrode of the fifth transistor;

a seventh transistor having a gate electrode configured to receive the first reference voltage, one electrode connected to the other electrode of the sixth transistor, and the other electrode connected to the first node; and an eighth transistor having a gate electrode configured to receive the second reference voltage, one electrode connected to the other electrode of the sixth transistor, and the other electrode connected to the second node.

18. The comparator of claim 17, wherein the second selector includes:

a first NAND gate configured to receive the first determination value and the second determination value;

an eighteenth transistor having a gate electrode configured to receive the clock signal and one electrode connected to the first power source;

a nineteenth transistor having a gate electrode configured to receive an output voltage of the first NAND gate and one electrode connected to the other electrode of the eighteenth transistor;

a twentieth transistor having a gate electrode configured to receive the first reference voltage, one electrode connected to the other electrode of the nineteenth transistor, and the other electrode connected to a third node;

a twenty-first transistor having a gate electrode configured to receive the second reference voltage, one electrode connected to the other electrode of the nineteenth transistor, and the other electrode connected to a fourth node;

a fourth inverter configured to invert the output value of the first NAND gate;

a twenty-second transistor having a gate electrode configured to receive the clock signal and one electrode connected to the first power source;

a twenty-third transistor having a gate electrode connected to an output end of the fourth inverter and one electrode connected to the other electrode of the twenty-second transistor;

a twenty-fourth transistor having a gate electrode configured to receive the first reference voltage, one electrode connected to the other electrode of the twenty-third transistor, and the other electrode connected to the third node; and a twenty-fifth transistor having a gate electrode configured to receive the second correction reference voltage, one electrode connected to the other electrode of the twenty-third transistor, and the other electrode connected to the fourth node.

19. A receiver comprising:

a first comparator configured to select one of a first reference voltage and a first correction reference voltage, based on a determination value of data at a past time of at least one adjacent channel, and compare a difference between the selected voltage and a second reference voltage with an input voltage at a current time of a target channel;

a second comparator configured to select one of the second reference voltage and a second correction reference voltage, based on the determination value of the data at the past time of the at least one adjacent channel, and compare a difference between the selected voltage and the first reference voltage with the input voltage; and a multiplexer configured to output one of an output value of the first comparator and an output value of the second comparator as a determination value of data at the current time of the target channel, based on a determination value of data at a past time of the target channel.

20. The receiver of claim 19, wherein the first correction reference voltage has a value between the first reference voltage and the second reference voltage, and the second correction reference voltage has a value between the first reference voltage and the second reference voltage, wherein the first correction reference voltage is larger than the second correction reference voltage.

* * * * *